United States Patent [19]
Yeh

[11] Patent Number: 5,946,598
[45] Date of Patent: Aug. 31, 1999

[54] PROCESS OF FABRICATING METAL GATE ELECTRODE

[75] Inventor: Wen-Kuan Yeh, Chupei, Taiwan

[73] Assignee: United Microelectronics Corporation, Hsinchu, Taiwan

[21] Appl. No.: 08/772,880

[22] Filed: Dec. 26, 1996

[30] Foreign Application Priority Data

Nov. 18, 1996 [TW] Taiwan ................................. 85114147

[51] Int. Cl.⁶ .................................................. H01L 21/44
[52] U.S. Cl. ........................... 438/683; 438/685; 438/655
[58] Field of Search ................................... 437/190, 192;
438/626, 677, 763, 782, 713, 695, 303,
398, 649, 683, 655, 685

[56] References Cited

U.S. PATENT DOCUMENTS

| | | | |
|---|---|---|---|
| 4,968,644 | 11/1990 | Gallagher et al. | 437/192 |
| 5,162,246 | 11/1992 | Ozturk et al. | 437/41 |
| 5,182,232 | 1/1993 | Chhabra et al. | 438/398 |
| 5,328,867 | 7/1994 | Chien et al. | 437/191 |
| 5,668,065 | 9/1997 | Lin | 438/303 |
| 5,677,213 | 10/1997 | Lee | 437/41 |
| 5,904,564 | 5/1999 | Park | 438/683 |

*Primary Examiner*—Chandra Chaudhari
*Assistant Examiner*—Reneé R. Berry
*Attorney, Agent, or Firm*—Fish & Richardson P.C.

[57] ABSTRACT

A process of fabricating metal gate electrodes for MOS transistors included in semiconductor IC devices is disclosed. The process includes first providing a silicon substrate having formed over the surface thereof the field oxide layers and a gate dielectric layer defined in the transistor active region. A thin layer of silicon is then formed over the surface of the gate dielectric layer. A metal layer is then deposited over the surface of the gate dielectric layer by performing an LPCVD procedure in a gaseous environment containing silane and tungsten fluoride. The LPCVD procedure deposits tungsten over the surface of the silicon layer by reducing the tungsten fluoride into tungsten atoms while consuming the thin silicon layer to exhaustion. The gate structure in the active region is then formed by patterning in the metal layer, and the gate structure includes the metal gate electrode layer and the gate dielectric layer.

23 Claims, 2 Drawing Sheets

PROCESS OF FABRICATING METAL GATE ELECTRODE

BACKGROUND OF THE INVENTION

1. Field of the Invention

This invention relates in general to the fabrication of semiconductor integrated circuits (ICs), and more particularly to a process for the fabrication of metal gate electrodes for metal-oxide semiconductor (MOS) transistors in semiconductor ICs.

2. Description of Related Art

A metal gate of MOS transistor is important for various semiconductor ICs due to the inherent small impedance of the gate. No additional fabrication procedure such as ion implantation is required in order to improve the electrical conductivity characteristics for metal gates under normal conditions. Tungston is one metal widely used as the material for the fabricating the metal gates of MOS transistors. The tungsten electrode for a MOS transistor metal gate is normally formed by utilizing a laser-enhanced chemical vapor deposition (CVD) procedure depositing tungsten in its plasma phase. Alternatively, physical sputtering procedure may be used. However, in procedures such as plasma- or laser-enhanced CVD and physical sputtering, it is not possible to expect full control of the settling location for all metal atoms stimulated in their plasma phase by laser irradiation. Deposition of the metal gate material in regions other than those defined for the gate structure is inevitable. Meanwhile, the deposition of other impurities in the gate electrode layer with additional energy may also degrade the expected electrical conduction characteristics of the fabricated gate structure. In other words, the electrical resistance of the fabricated gate electrode is increased as a result of the difficulty in the control over the deposition region and the deposition of impurities.

On the other hand, although fabrication procedures such as low-pressure CVD are substantially free of the problem of electrode quality degradation due to the above-mentioned disadvantageous controlling factors in laser-enhanced CVD, the deposition conditions for metals such as tungsten are considered relatively poor in the relatively lower processing temperature range. Optimized temperatures for the effective tungsten deposition should be at least higher than 350° C. This contradicts the low temperature requirement of low-temperature CVD.

To further outline the invention, a conventional process for fabricating a tungsten electrode for MOS transistor in semiconductor devices is examined in the following paragraphs, with reference to the accompanying drawings FIGS. 1A–1C.

First, as is shown in FIG. 1A, a P-type silicon substrate 10 is used as the basis for the construction of the semiconductor device containing the MOS transistor to be fabricated. A procedure for local oxidation of silicon (LOCOS) is then performed to form the field oxide regions 12 that serve to isolate the MOS transistor. In between the field oxide regions 12, as is schematically shown in the cross-sectional view, a layer of silicon dioxide 14 is then formed covering the surface of the substrate 10 in the transistor active region.

Then, in FIG. 1B, a physical sputtering procedure is employed to form a tungsten layer covering the surface of both the field oxide layer 12 and the silicon dioxide layer 14. A photolithographic and etching procedure then follows to define patterning in the sputtered tungsten layer and the silicon dioxide layer, so as to form the gate electrode structure as shown in the drawing, wherein reference numeral 16 designates the tungsten gate electrode layer while 18 designates the gate oxide layer. After the formation of this gate structure, N-type impurities are then implanted into the regions of the exposed substrate 10 surrounding the gate structure. This forms the Ntype lightly-doped regions 20 as shown in FIG. 1B.

Finally, as shown in FIG. 1C, sidewall spacers 22 are formed over the surface of the gate structure covering the sidewalls of the tungsten gate electrode layer 16 and the gate oxide layer 18. These sidewall spacers 22 may then be used as shielding masks for the implementation of another impurity implantation procedure, in which relatively higher concentration of N-type impurities are implanted into the regions of the lightly-doped regions 20 exposed out of shielding by the sidewall spacers 22. As a result, source/drain diffusion regions 24 for the fabricated MOS transistor can be formed as shown in the drawing.

Up to this stage, fabrication of the MOS transistor may be considered to be generally complete. However, as indicated above, a tungsten layer for the gate electrode has to be formed in the physical sputtering procedure which was conducted at relatively lower temperature. This inevitably leads to poorer efficiency in forming the tungsten layer. As is well known by persons skilled in the art, tungsten is better sputterdeposited at a temperature higher than 350° C.

SUMMARY OF THE INVENTION

It is therefore an object of the invention to provide a process for fabricating the metal gate electrode of a MOS transistor for semiconductor IC devices in a low temperature processing environment to prevent degradation of the metal gate electrode electrical conductivity characteristics.

The present invention achieves the above-identified objects by providing a process of fabricating metal gate electrodes for MOS transistors included in semiconductor IC devices. The process includes first providing a silicon substrate having formed over the surface thereof the field oxide layers and a gate dielectric layer defined in the transistor active region. A thin layer of silicon is then formed over the surface of the gate dielectric layer. A metal layer is then deposited over the surface of the gate dielectric layer by performing an LPCVD procedure in a gaseous environment containing silane and tungsten fluoride. The LPCVD procedure deposits tungsten over the surface of the silicon layer by reducing the tungsten fluoride into tungsten atoms while consuming the thin silicon layer to exhaustion. The gate structure in the active region is then formed by patterning in the metal layer, and the gate structure includes the metal gate electrode layer and the gate dielectric layer.

BRIEF DESCRIPTION OF THE DRAWINGS

Other objects, features, and advantages of the present invention will become apparent by way of the following detailed description of the preferred but nonlimiting embodiments. The description is made with reference to the accompanying drawings in which.

DESCRIPTION OF THE PREFERRED EMBODIMENT

Figure 1A:
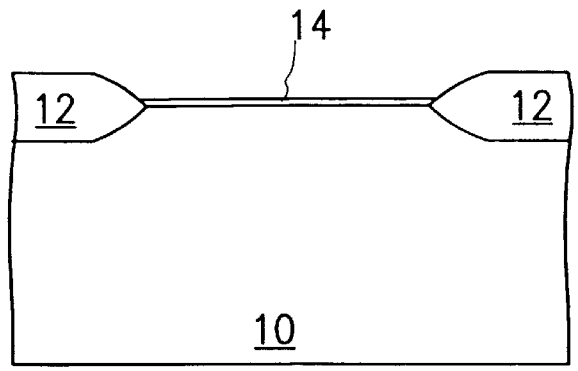
FIGS. 1A–1C are respectively cross-sectional views showing the process stages as depicted in a prior art process for the fabrication of a metal gate electrode for a MOS transistor.
Figure 1B:
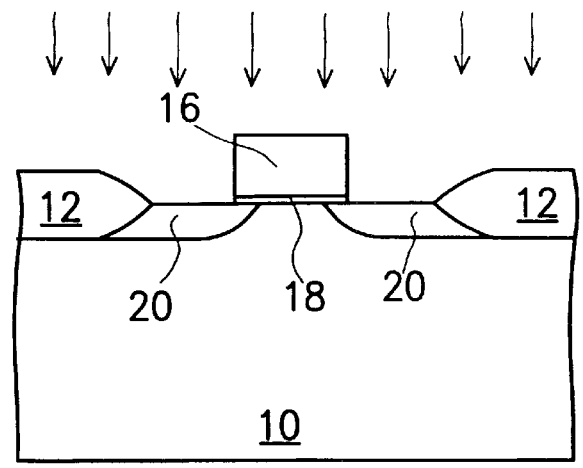
Figure 1C:
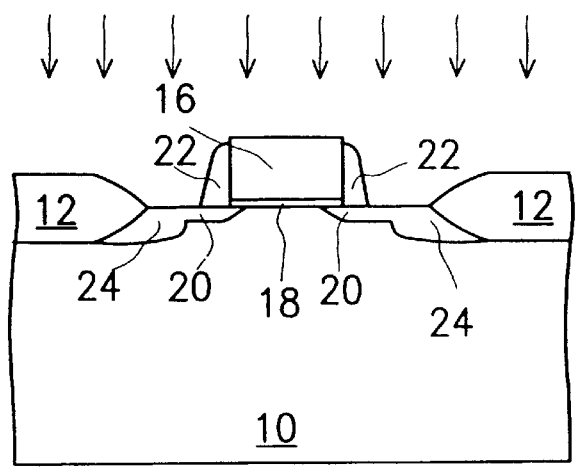
Figure 2A:
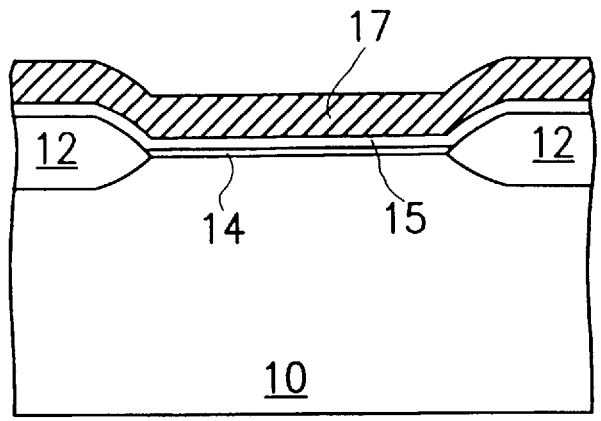
FIGS. 2A–2C are respectively cross-sectional views showing the process stages outlining a process for fabricating the metal gate electrode for a MOS transistor in accordance with a preferred embodiment of the invention.
Figure 2B:
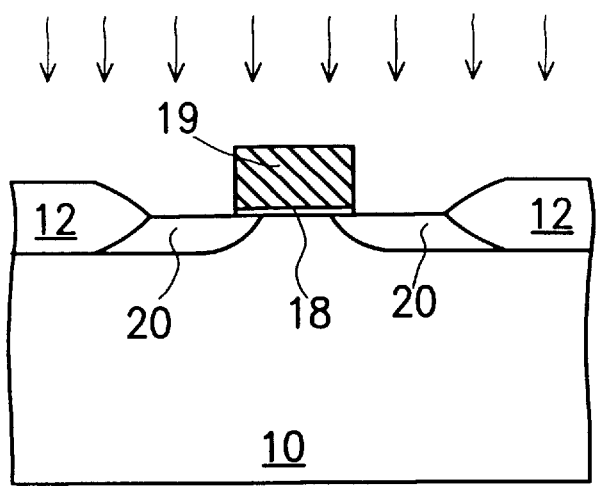
Figure 2C:
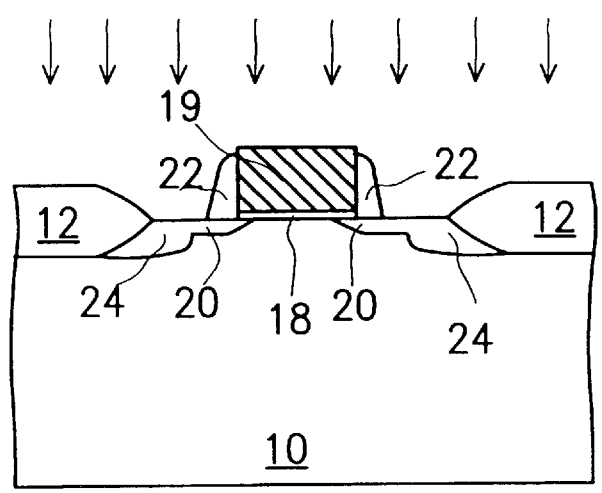

With reference to FIGS. 2A–2C, process stages for fabricating a metal gate electrode for a MOS transistor of a semiconductor IC device in accordance with a preferred embodiment are outlined for the description of the invention.

As is shown in FIG. 2A, a P-type silicon substrate 10 is used as the basis for the construction of the semiconductor IC device containing the MOS transistor to be fabricated. Based on the procedure similar to that described for the prior art, field oxide regions 12 and the silicon oxide layer 14 to be used as the gate dielectric layer are subsequently formed in the transistor active region. This can be done, for example, by first implementing a LOCOS procedure to form the field oxide regions 12 on the surface of the substrate 10 that serve to isolate the MOS transistor. In between the field oxide regions 12, a layer of silicon dioxide 14 is then formed covering the surface of the substrate 10.

After the formation of the field oxide regions 12 and the gate oxide layer 14, a relatively thinner layer of silicon 15, such as of monosilicon, polysilicon, or epitaxial silicon, may be deposited over the surface of the device substrate 10, covering the surface of both the field oxide regions 12 as well as the gate oxide layer 14. In a preferred embodiment, the deposited silicon layer 15 may have a thickness of about 100–250 Å. This deposited silicon layer 15 serves to provide an interfacing surface that allows better adhesion for the following metal layer to be deposited.

Then, in a controlled gaseous environment containing silane and elevated to a temperature of about 300° C., tungsten fluoride ($WF_6$) is reduced, allowing tungsten atoms to be deposited over the exposed surface of the silicon layer 15. During this procedure, the thin layer of silicon 15 is gradually consumed to exhaustion, and a pure tungsten layer 17 may thus be formed directly above the surface of the field oxide regions 12 and the gate oxide layer 14. Note that the drawing shown in FIG. 2A schematically depicts the on-going process of the formation of the tungsten layer 17 before the silicon layer 15 is totally consumed.

Then, as is shown in FIG. 2B, a photolithographic and etching procedure then follows to define patterning in the deposited tungsten layer 17 (FIG. 2A) and the silicon dioxide layer 14, so as to form the gate electrode structure including the tungsten gate electrode layer 19 and the gate oxide layer 18 as shown in the drawing. After the formation of this gate structure, N-type impurities are then implanted into the regions of the exposed substrate 10 surrounding the gate structure. This forms the N-type lightly-doped regions 20 as shown in FIG. 2B.

Finally, as shown in FIG. 2C, sidewall spacers 22 are then formed over the surface of the gate structure covering the sidewalls of the tungsten gate electrode layer 19 and the gate oxide layer 18. Sidewall spacers 22 are then be used as shielding masks for implementing another impurity implantation procedure, in which relatively higher concentration of N-type impurities are implanted into the regions of the lightlydoped regions 20 exposed out of shielding by the sidewall spacers 22. Source/drain diffusion regions 24 for the fabricated MOS transistor can thus be formed as shown in the drawing.

Thus, due to the introduction of the intermediate silicon layer 15 as formed over the surface of the device substrate 10 where the gate structure is to be established, tungsten layer can be formed at a relatively lower temperature of 300° C. than that required by the prior art process of more than 350° C. for its physical sputtering. Presence of this intermediate silicon layer 15 not only assists in the low temperature deposition of the tungsten metal, it also helps improve the adhesion characteristics of the formed tungsten layer. The result is a tungsten layer having improved electrical conductivity characteristics that is better suited for the use as the gate electrode for the MOS transistor to be fabricated.

While the invention has been described by way of example and in terms of a preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A process of fabricating a metal gate electrode layer for a metal-oxide semiconductor transistor in an integrated circuit device comprising the steps of:

providing a silicon substrate having a surface with field oxide layers and a gate dielectric layer formed over the surface to define a transistor active region;

forming a thin layer of silicon over a surface of said gate dielectric layer;

forming a metal layer over the surface of said gate dielectric layer by depositing a metal over the surface of said thin silicon layer, the formation of said metal layer completely consuming said thin silicon layer to exhaustion; and forming a gate structure in said transistor active region by patterning, in said metal layer, said gate structure comprising a metal gate electrode layer and a gate dielectric layer.

2. The process of claim 1, wherein said metal layer is formed in a low-pressure chemical vapor deposition procedure.

3. The process of claim 2, wherein said low-pressure chemical vapor deposition procedure is performed at a temperature in the range of about 250 to 330° C.

4. The process of claim 3, wherein said low-pressure chemical vapor deposition procedure is performed in a gaseous environment containing silane and tungsten fluoride.

5. The process of claim 4, wherein said silicon substrate is a P-type substrate.

6. The process of claim 4, wherein said silicon substrate is an N-type substrate.

7. The process of claim 4, wherein said gate dielectric layer is a silicon dioxide layer.

8. The process of claim 4, wherein said thin silicon layer is a monosilicon layer.

9. The process of claim 4, wherein said thin silicon layer is a polysilicon layer.

10. The process of claim 4, wherein said thin silicon layer is an epitaxial silicon layer.

11. The process of claim 4, wherein said thin silicon layer has a thickness in the range of about 100 to 250 Å.

12. The process of claim 3, wherein said low-pressure chemical vapor deposition procedure is performed in a gaseous environment containing silane and aluminum fluoride.

13. A process of fabricating the metal gate electrode layer for a metal-oxide semiconductor transistor in an integrated circuit device comprising the steps of:

providing a silicon substrate having a surface with field oxide layers and a gate dielectric layer formed over the surface to define a transistor active region;

forming a thin layer of silicon over a surface of said gate dielectric layer;

forming a metal layer over the surface of said gate dielectric layer by performing a low-pressure chemical vapor deposition procedure in a gaseous environment containing silane and tungsten fluoride, said low-pressure chemical vapor deposition procedure depositing tungsten over the surface of said silicon layer by reducing said tungsten fluoride into tungsten atoms while completely consuming said thin silicon layer to exhaustion; and forming a gate structure in said transistor active region by patterning, in said metal layer, said gate structure comprising a metal gate electrode layer and a gate dielectric layer.

14. The process of claim 13, wherein said low-pressure chemical vapor deposition procedure is performed at a temperature of about 250 to 330°C.

15. The process of claim 14, wherein said silicon substrate is a P-type substrate.

16. The process of claim 14, wherein said silicon substrate is an N-type substrate.

17. The process of claim 14, wherein said gate dielectric layer is a silicon dioxide layer.

18. The process of claim 14, wherein said thin silicon layer is a monosilicon layer.

19. The process of claim 14, wherein said thin silicon layer is a polysilicon layer.

20. The process of claim 14, wherein said thin silicon layer is an epitaxial silicon layer.

21. The process of claim 14, wherein said thin silicon layer has a thickness in the range of about 100 to 250 Å.

22. The process of claim 1 wherein forming a metal layer over the surface of said gate dielectric further includes forming a metal layer on the surface of said gate dielectric.

23. The process of claim 13 wherein forming a metal layer over the surface of said gate dielectric further includes forming a metal layer on the surface of said gate dielectric.

* * * * *